United States Patent [19]
Yang

[11] Patent Number: 5,444,002
[45] Date of Patent: Aug. 22, 1995

[54] METHOD OF FABRICATING A SHORT-CHANNEL DMOS TRANSISTOR WITH REMOVABLE SIDEWALL SPACERS

[75] Inventor: Sheng-Hsing Yang, Hsinchu, Taiwan

[73] Assignee: United Microelectronics Corp., Hsinchu, Taiwan

[21] Appl. No.: 172,616

[22] Filed: Dec. 22, 1993

[51] Int. Cl.[6] .......................................... H01L 21/265
[52] U.S. Cl. ............................ 437/27; 437/41; 437/44
[58] Field of Search .......................... 437/27, 44, 41

[56] References Cited

U.S. PATENT DOCUMENTS

| 4,722,909 | 2/1988 | Parillo et al. | |
|---|---|---|---|
| 5,320,974 | 6/1994 | Hori | 437/44 |
| 5,328,862 | 7/1994 | Goo | 437/40 |
| 5,369,045 | 11/1994 | Ng et al. | 437/41 |

FOREIGN PATENT DOCUMENTS

| 4318866 | 12/1993 | Germany | 437/44 |
|---|---|---|---|
| 74848 | 3/1991 | Japan | 437/44 |

Primary Examiner—Brian E. Hearn
Assistant Examiner—Leon Radomsky
Attorney, Agent, or Firm—Ladas & Parry

[57] ABSTRACT

The present invention relates to a method of forming a double diffused metal-oxide-semiconductor (DMOS) transistor which enables the formation of short channels. This method uses silicon nitride sidewall spacers so that the sidewall spacers can be removed without etching the field oxide, therefore the length of the channel can be minimized to reduce the channel resistance.

2 Claims, 3 Drawing Sheets

METHOD OF FABRICATING A SHORT-CHANNEL DMOS TRANSISTOR WITH REMOVABLE SIDEWALL SPACERS

FIELD OF THE INVENTION

The present invention relates to double diffused metal-oxide-semiconductor (DMOS) transistors, and in particular to a method of forming a DMOS transistor which enables the formation of short channels.

BACKGROUND OF THE INVENTION

FIG. 1 shows the cross section of a conventional lateral DMOS (LDMOS) transistor. In the formation of conventional LDMOS transistors, for instance, N-type semiconductor substrate 10 is provided. A field oxide layer 11 is formed on the substrate in a floating region, then a gate 12 is formed thereon. P-type ions are implanted to form a P-type base region 13 using the gate 12 as a mask. Then, the P-type base region 13 is driven-in, so that the P-type base region 13 extends under the gate 12. N-type ions are implanted in the P-type base region 13 using the gate as a mask and then driven-in to form an N-type source region 14.

in the above discussed LDMOS transistor, the channel length of the LDMOS transistor 1 is determined by the drive-in steps, which can not be accurately controlled in order to obtain a short channel. But a short channel is critical for better characteristics of the transistor.

The cross-section of a conventional vertical DMOS (VDMOS) transistor during various steps in its formation is shown in FIGS. 2a to 2c. As shown in FIG. 2a, oxide sidewall spacers 22 are formed on the sidewalls of a gate 21 on an N-type substrate 20. Thereafter, as shown in FIG. 2b, P-type ions are implanted in the N-type substrate 20 to form P-type base regions 23. Referring to FIG. 2c, the sidewall spacers 22 are then removed. N-type ions are implanted in the P-type base regions and driven-in, to form N-type source region 24.

However, the above mentioned method for fabricating VDMOS transistors can not be applied to LDMOS transistor fabrication for reducing its channel length, because the field oxide layer in the floating region will be etched when removing the oxide sidewall spacers.

SUMMARY OF THE INVENTION

It is therefore for the present invention to provide a method of fabricating a short-channel DMOS transistor, having a gate formed on a first conductivity type semiconductor material. The method comprises the following steps: forming silicon nitride sidewall spacers on the sidewalls of said gate; introducing impurities of a second conductivity type into said semiconductor material to form base region of the second conductivity type using said gate and the silicon nitride sidewall spacers as a mask; driving in the impurities of the second conductivity type and removing the silicon nitride sidewall spacers; and introducing and driving in impurities of the first conductivity type into the base regions of the second conductivity type using said gate as a mask.

BRIEF DESCRIPTION OF THE DRAWING

The present invention will be more fully understood from the detailed description given hereinafter with reference to and the accompanying drawings which are given by way of illustration only, and thus are not limitative of the present invention and wherein.

DETAILED DESCRIPTION OF THE PREFERRED EMBODIMENT

Figure 1:
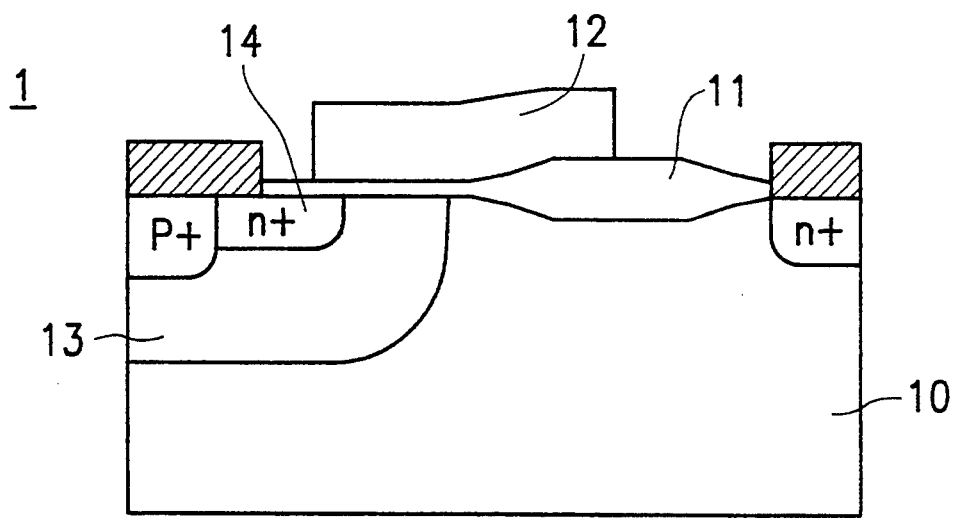
FIG. 1 is the cross section of a conventional lateral DMOS (LDMOS) transistor.
Figure 2A:
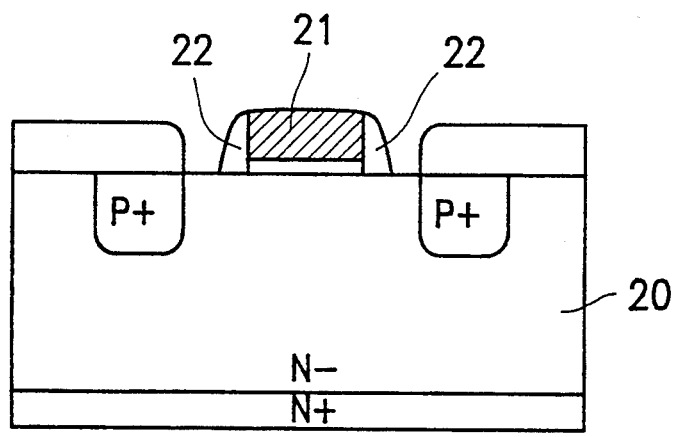
FIG. 2a to 2c is the cross-section of a conventional vertical DMOS (VDMOS) transistor during various steps in its formation.
Figure 2B:
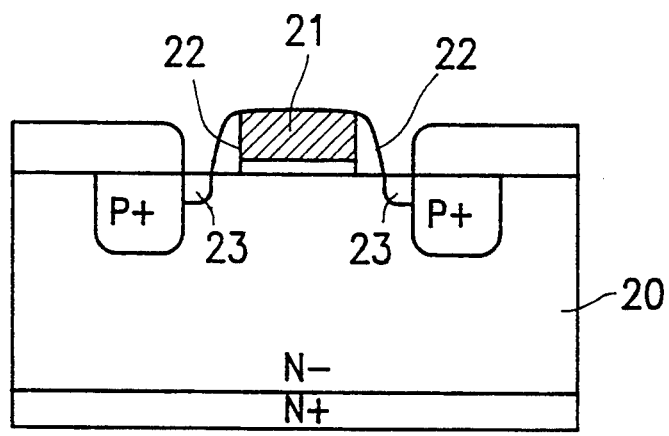
Figure 2C:
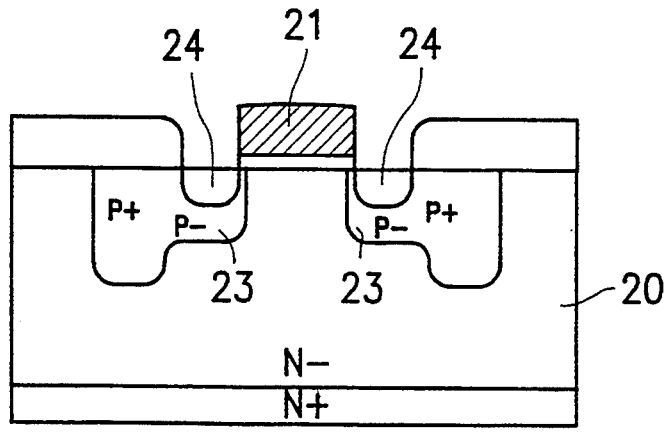
Figure 3A:
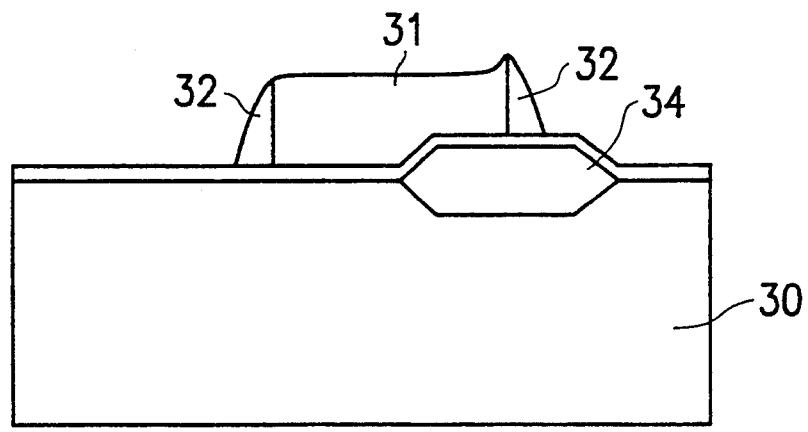
FIG. 3a to 3c is the cross-section of a short-channel DMOS transistor during various steps in its formation according to the present invention.
Figure 3B:
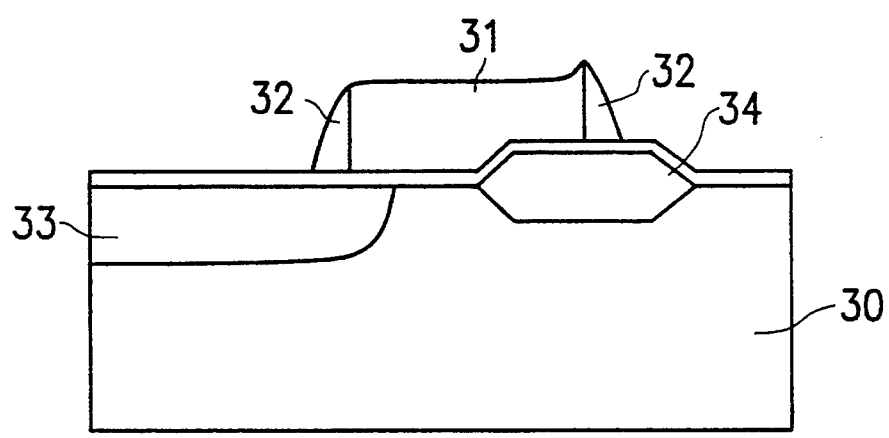
Figure 3C:
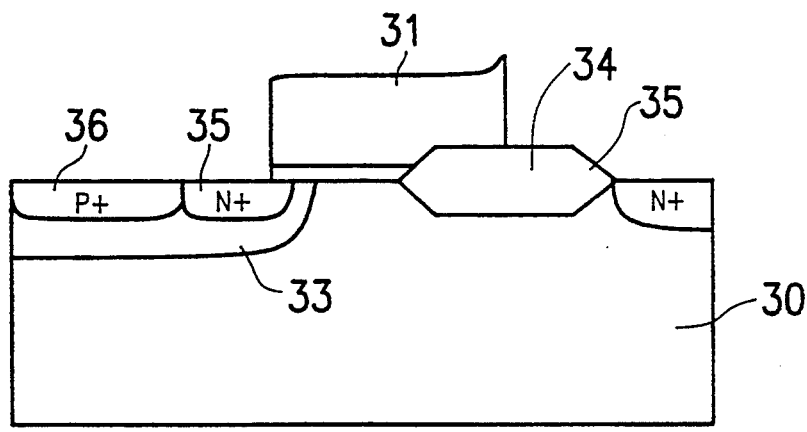

Please refer to FIGS. 3a to 3c which show the cross-section of a short-channel DMOS transistor during various steps of its formation according to the present invention. While the present invention can be applied to transistors having substrates of either N-type or P-type material, only a transistor having N-type substrate is discussed hereinafter, because the processing steps for P-type substrate are similar and would be unduly apparent to a person skilled in the art.

First, as shown in FIG. 3a, silicon nitride sidewall spacers 32 are formed at two sides of a gate 31 on a substrate 30 of N-type semiconductor material having a oxide region 34. That is, a silicon nitride layer is deposited over the gate 31 and over the top surface of the substrate 30, and then the silicon nitride layer is etched by conventional etching techniques, e.g. plasma etching, so as to leave the silicon nitride sidewall spacers 32.

Second, as shown in FIG. 3b, P-type impurities are implanted into the N-type substrate 30 to form a P-type base region 33 while using the gate 31 and the sidewall spacers 32 as a mask. That is, a photoresist layer is formed by conventional lithography techniques, then P-type impurities are planted to form the P-type base region 33, and then the photoresist layer is removed. Then a drive-in step is performed to drive in the P-type base region 33 under the gate 31. After that, the silicon nitride sidewall spacers 32 are removed by known conventional techniques for removing silicon nitride. The region oxide 34 of silicon oxide will not be etched by selecting an appropriate etchant which does not affect silicon oxide. Moreover, the drive-in step can be performed after the silicon nitride sidewall spacers are removed, if desired.

Thereafter, as shown in FIG. 3c, N-type and P-type impurities are implanted, to form N+ source and drain regions 35, and a P+ contact region 36 for the P-type base region 33. Other final processes steps are the same as conventional devices.

As stated above, the method of forming a short-channel DMOS transistor according to the present invention uses silicon nitride to form the sidewall spacers, therefore the channel length of the DMOS transistor can be reduced, so as to decrease the channel resistance. And, in particular, this method is similar to the conventional VDMOS process, therefore it can be also applied to VDMOS transistor manufacturing, to simplify the manufacturing process when producing both kinds of DMOS transistors in a factory.

While the invention has been described by way of examples and in terms of the preferred embodiment, it is to be understood that the invention need not be limited to the disclosed embodiment. On the contrary, it is intended to cover various modifications and similar arrangements included within the spirit and scope of the appended claims, the scope of which should be accorded the broadest interpretation so as to encompass all such modifications and similar structures.

What is claimed is:

1. A method of making a lateral double-diffused metal-oxide-semiconductor transistor comprising the steps of:
   (a) forming a gate on a substrate of semiconductor material of a first conductivity type, wherein said substrate has a region of silicon oxide formed therein and wherein said gate is formed over said substrate of semiconductor material of a first conductivity type and over a portion of said region of silicon oxide;
   (b) forming a silicon nitride sidewall spacer on a sidewall of said gate;
   (c) introducing an impurity of a second conductivity type into said semiconductor material to form a base region of the second conductivity type using said gate and the sidewall spacer as a mask;
   (d) driving the impurity of a second conductivity type into said substrate and at least partially under said gate;
   (e) removing the silicon nitride sidewall spacer; and
   (f) introducing impurities of the first conductivity type into said base region of the second conductivity type using said gate as a mask.

2. The method of claim 1 wherein the steps of introducing an impurity of a second conductivity type and driving the impurity of a second conductivity type into said substrate and at least partially under said gate occur along an edge of said gate remote from said region of silicon oxide.

* * * * *